United States Patent
Siebels et al.

(10) Patent No.: US 9,688,438 B2
(45) Date of Patent: Jun. 27, 2017

(54) METHOD FOR THE PLASMA TREATMENT OF WORKPIECES AND WORKPIECE WITH A GAS BARRIER LAYER

(75) Inventors: Sonke Siebels, Hamburg (DE); Michael Herbort, Hamburg (DE)

(73) Assignee: KHS Corpoplast GmbH, Hamburg (DE)

( * ) Notice: Subject to any disclaimer, the term of this patent is extended or adjusted under 35 U.S.C. 154(b) by 263 days.

(21) Appl. No.: 14/123,090

(22) PCT Filed: Jun. 15, 2012

(86) PCT No.: PCT/EP2012/002551
§ 371 (c)(1),
(2), (4) Date: Nov. 27, 2013

(87) PCT Pub. No.: WO2012/171661
PCT Pub. Date: Dec. 20, 2012

(65) Prior Publication Data
US 2014/0106102 A1    Apr. 17, 2014

(30) Foreign Application Priority Data
Jun. 16, 2011   (DE) .................. 10 2011 104 730

(51) Int. Cl.
*B65D 25/14*       (2006.01)
*C23C 16/04*       (2006.01)
(Continued)

(52) U.S. Cl.
CPC ............. *B65D 25/14* (2013.01); *B65D 25/34* (2013.01); *C23C 16/045* (2013.01);
(Continued)

(58) Field of Classification Search
None
See application file for complete search history.

(56) References Cited

U.S. PATENT DOCUMENTS 5,702,770 A      12/1997  Martin
5,955,161 A *     9/1999  Tropsha .................. A61L 31/08
                                                       428/34.4
(Continued)

FOREIGN PATENT DOCUMENTS

DE    19901834 A1    7/2000
DE    10054653 A1    5/2002
(Continued)

OTHER PUBLICATIONS

English Translation of the International Preliminary Report on Patentability dated Dec. 17, 2013, in corresponding International Application No. PCT/EP2012/002551, filed Jun. 15, 2012.

*Primary Examiner* — Joseph Miller, Jr.
(74) *Attorney, Agent, or Firm* — Rankin, Hill & Clark LLP

(57) ABSTRACT

The method serves for the plasma treatment of container-like workpieces. The workpiece is inserted into an at least partially evacuable chamber of a treatment station. The plasma chamber is bounded by a chamber base, a chamber cover and a lateral chamber wall. The plasma treatment causes a coating to be deposited on the workpiece. The plasma is ignited by microwave energy. The coating consists at least of a gas barrier layer and a bonding layer arranged between the workpiece and the gas barrier layer. The gas barrier layer contains SiOx and the bonding layer contains carbon. The gas barrier layer is produced from a gas that contains at least one silicon compound and argon.

6 Claims, 9 Drawing Sheets

Figure 1:
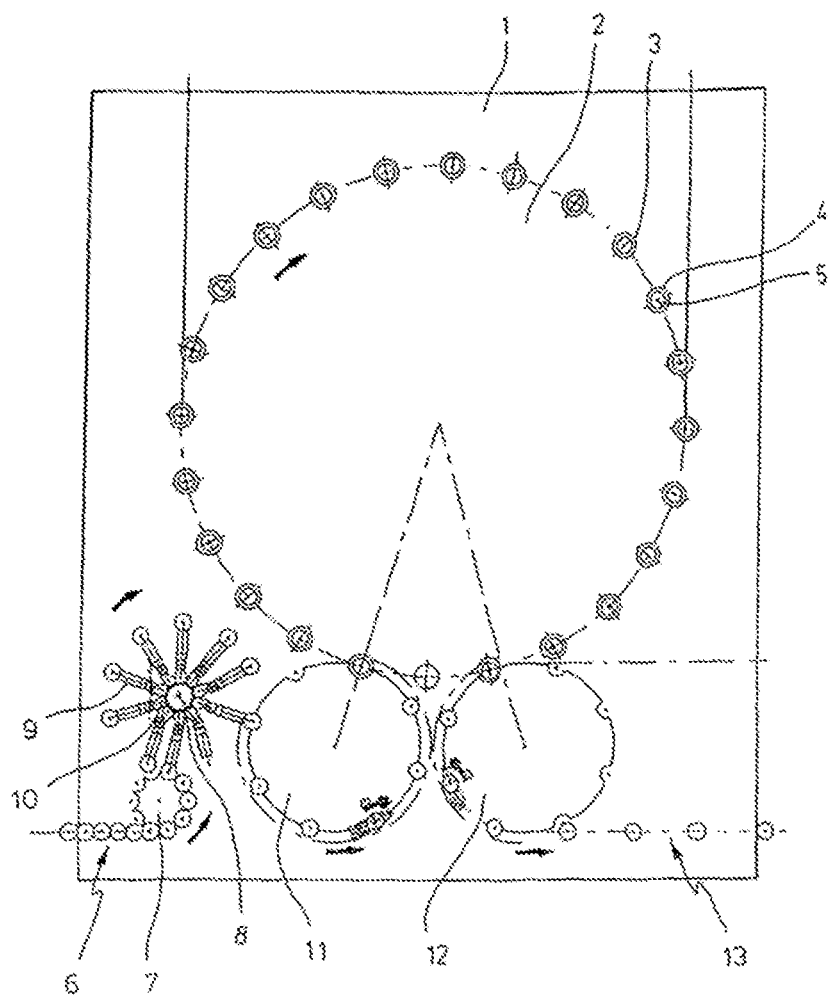

| Sample Number | Gas Barrier Layer | | | | | | | | | |
|---|---|---|---|---|---|---|---|---|---|---|
| | Gas Stabilization Time HV [ms] | Process Duration [s] | Output [Watt] | Pulse Time HV [ms] | Pause Time HV [ms] | Process Pressure [mbar] | HMDSO Flow HV [sccm] | O2 Flow HV [sccm] | Ar Flow BA [sccm] | Ar Mole % of Process Gas |
| 1 | | 3.5 | 1281 (1500) | 9 | 30 | 0.23 | 7 | 750 | 0 | |
| 1 | 289 | 3.5 | 1281 (1500) | 9 | 30 | 0.23 | 7 | 750 | - | 0.0 |
| 2 | 289 | 3.5 | 1281 (1500) | 9 | 30 | 0.23 | 7 | 650 | 70 (x1.4=98) | 13.3 |
| 3 | 289 | 3.5 | 1281 (1500) | 9 | 30 | 0.23 | 7 | 550 | 140 (x1.4=196) | 26.7 |
| 4 | 289 | 3.5 | 1281 (1500) | 9 | 30 | 0.23 | 7 | 450 | 210 (x1.4=294) | 40.0 |
| 5 | 289 | 3.5 | 1281 (1500) | 9 | 30 | 0.23 | 7 | 350 | 280 (x1.4=392) | 23.3 |

(51) Int. Cl.
  *C23C 16/40* (2006.01)
  *C23C 16/511* (2006.01)
  *C23C 16/515* (2006.01)
  *B65D 25/34* (2006.01)

(52) U.S. Cl.
  CPC .......... *C23C 16/401* (2013.01); *C23C 16/511* (2013.01); *C23C 16/515* (2013.01); *Y10T 428/1379* (2015.01)

(56) References Cited

U.S. PATENT DOCUMENTS

| | | |
|---|---|---|
| 6,294,226 B1 | 9/2001 | Shimamura |
| 6,426,144 B1 | 7/2002 | Grunwald et al. |
| 2002/0006487 A1* | 1/2002 | O'Connor ................ C08J 7/06 428/35.7 |
| 2004/0076836 A1 | 4/2004 | Beldi et al. |
| 2005/0118428 A1* | 6/2005 | Bicker ................ B05D 1/62 428/411.1 |
| 2007/0248768 A1* | 10/2007 | Loboda ................ C23C 16/30 427/574 |
| 2008/0090039 A1* | 4/2008 | Klein ................ C23C 16/30 428/35.7 |
| 2008/0237181 A1* | 10/2008 | Wagner ................ C23C 16/0245 216/13 |
| 2009/0104392 A1* | 4/2009 | Takada ................ C23C 16/045 428/36.6 |
| 2010/0193461 A1 | 8/2010 | Boutroy et al. |

FOREIGN PATENT DOCUMENTS

| | | |
|---|---|---|
| DE | 10258681 A1 | 2/2004 |
| DE | 102004020185 A1 | 11/2005 |
| DE | 102006048658 A1 | 4/2008 |
| EP | 1911794 A1 | 4/2008 |
| JP | 2003328132 A2 | 11/2003 |
| WO | 95/22413 A1 | 8/1995 |
| WO | 99/17334 A1 | 4/1999 |
| WO | 00/58631 A1 | 10/2000 |
| WO | 01/31680 A1 | 5/2001 |
| WO | 03/014412 A1 | 2/2003 |
| WO | 2012/089196 A1 | 7/2012 |

\* cited by examiner

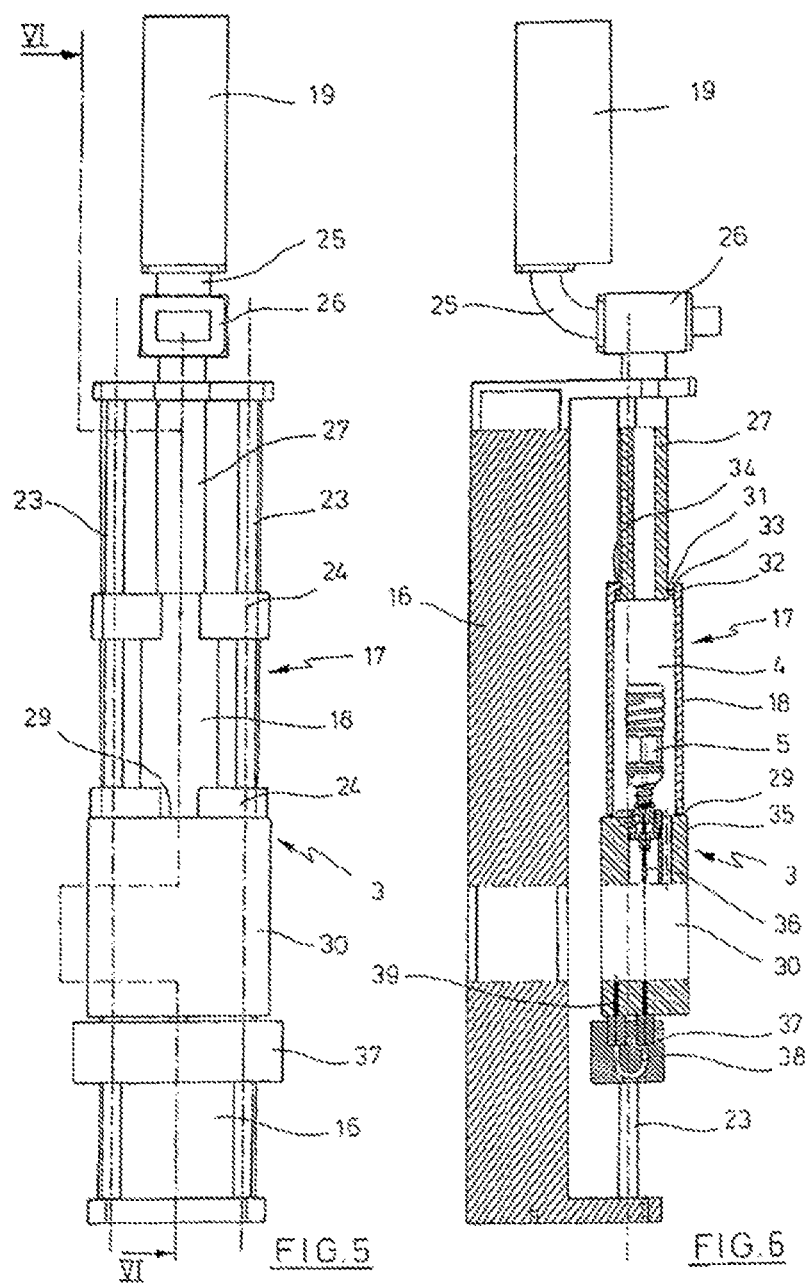

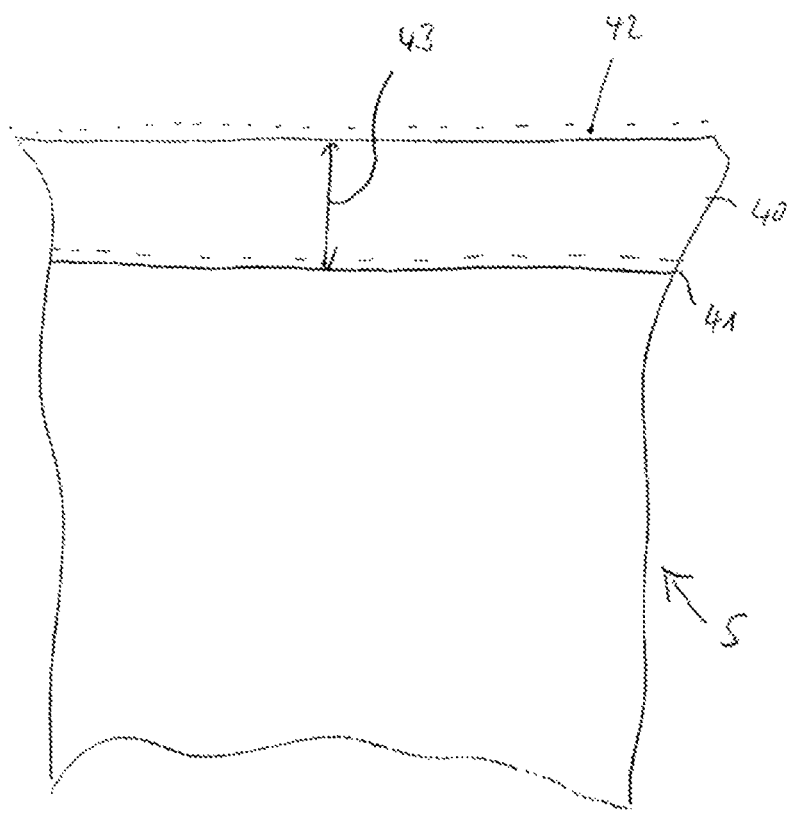

| Sample Number | Gas Barrier Layer | | | | | | | | |
|---|---|---|---|---|---|---|---|---|---|
| | Gas Stabilization Time HV [ms] | Process Duration [s] | Output [Watt] | Pulse Time HV [ms] | Pause Time HV [ms] | Process Pressure [mbar] | HMDSO Flow HV [sccm] | O2 Flow HV [sccm] | Ar Flow BA [sccm] | Ar Mole % of Process Gas |
| 1 | | 3.5 | 1281 (1500) | 9 | 30 | 0.23 | 7 | 750 | 0 | |
| 1 | 289 | 3.5 | 1281 (1500) | 9 | 30 | 0.23 | 7 | 750 | - | 0.0 |
| 2 | 289 | 3.5 | 1281 (1500) | 9 | 30 | 0.23 | 7 | 650 | 70 (x1.4=98) | 13.3 |
| 3 | 289 | 3.5 | 1281 (1500) | 9 | 30 | 0.23 | 7 | 550 | 140 (x1.4=196) | 26.7 |
| 4 | 289 | 3.5 | 1281 (1500) | 9 | 30 | 0.23 | 7 | 450 | 210 (x1.4=294) | 40.0 |
| 5 | 289 | 3.5 | 1281 (1500) | 9 | 30 | 0.23 | 7 | 350 | 280 (x1.4=392) | 23.3 |

Fig. 8

| Sample Number | Bonding Layer | | | | | | | |
|---|---|---|---|---|---|---|---|---|
| | Gas Stabilization Time HV [ms] | Process Duration [s] | Output [Watt] | Pulse Time HV [ms] | Pause Time HV [ms] | Process Pressure [mbar] | HMDSO Flow HV [sccm] | O2 Flow HV [sccm] |
| 1 | | 1.1 | 1366 (1600) | 0.4 | 10 | 0.33 | 30 | 220 |
| 1 | 300 | 1.1 | 1366 (1600) | 0.4 | 10 | 0.33 | 30 | 220 |
| 2 | 300 | 1.1 | 1366 (1600) | 0.4 | 10 | 0.33 | 30 | 220 |
| 3 | 300 | 1.1 | 1366 (1600) | 0.4 | 10 | 0.33 | 30 | 220 |
| 4 | 300 | 1.1 | 1366 (1600) | 0.4 | 10 | 0.33 | 30 | 220 |
| 5 | 300 | 1.1 | 1366 (1600) | 0.4 | 10 | 0.33 | 30 | 220 |

Fig. 9

METHOD FOR THE PLASMA TREATMENT OF WORKPIECES AND WORKPIECE WITH A GAS BARRIER LAYER

The invention relates to a method for plasma treatment of container-like workpieces, in which the workpiece is inserted into a plasma chamber and in which under the influence of a vacuum a coating is subsequently deposited on the workpiece following ignition of the plasma, and in which the plasma is ignited by microwave energy, wherein the coating consists of at least one gas barrier layer and a bonding layer arranged between the workpiece and the gas barrier layer, and in which the gas barrier layer contains SiOx and the bonding layer contains carbon.

The invention also relates to a workpiece with a container-like shape, which is made of a thermoplastic material and is provided in the region of at least one surface with a gas barrier layer deposited from a plasma, said layer containing SiOx, and in which a bonding layer containing carbon is arranged between the workpiece and the gas barrier layer.

Such methods are used, for example, for providing synthetic materials with surface coatings. In particular, also already known are devices of this type for coating inner and outer surfaces of containers which are intended for packaging liquids. Moreover, devices for plasma sterilization are known.

PCT-WO 95/22413 describes a plasma chamber for the internal coating of bottles made of PET. The bottles to be coated are lifted through a movable bottom into a plasma chamber and are connected to an adapter in the area of a bottle opening. An evacuation of the bottle interior can be effected through the adapter. Moreover, a hollow gas lance is introduced into the interior of the bottles in order to supply process gas. A microwave is used to ignite the plasma.

It is also known from this publication to arrange a plurality of plasma chambers on a rotating wheel. This supports a high production rate of bottles per unit of time.

In EP-OS 10 10 773 a supply device is explained for evacuating the interior of the bottle and supplying it with process gas. PCT-WO 01/31680 describes a plasma chamber into which the bottles are inserted by a movable cover which previously had been connected to the mouth portion of the bottles.

PCT-WO 00/58631 also already shows the arrangement of plasma stations on a rotating wheel and describes for such an arrangement an allocation of negative pressure pumps and plasma stations in groups, in order to support a favorable evacuation of the chambers as well as the inner spaces of the bottles. Also mentioned is the coating of several containers in a common plasma station or a common cavity.

Another arrangement for carrying out an internal coating of bottles is described in PCT-WO 99/17334. In this case, an arrangement of a microwave generator above the plasma chamber in particular, as well as a vacuum and operation medium through a bottom of the plasma chamber, is described.

In DE 10 2004 020 185 A1 a gas lance is already described which can be moved into the interior of a preform to be coated and for supplying process gas. The gas lance can be positioned in the longitudinal direction of the container.

In a predominant number of the known devices, container layers of silicone oxides produced by the plasma having the general chemical formula SiOx are used for improving barrier properties of the thermoplastic material. Such barrier layers prevent oxygen from penetrating into the packaged liquids, as well as carbon dioxide from escaping in the case of liquids containing $CO_2$.

In WO 03/014412 A1, the execution of a plasma coating process is described, in which the required energy is input by means of pulsed microwave energy. For the general execution of the coating process, a suitable pulse width and pulse height are selected for the microwave energy. Pause times between the individual impulses are likewise set and are held constant for the duration of the coating. In executing the coating process, this prior art varies the volume stream for the process gases supplied as well as the mix of process gases. Typically, the mixture ratios and/or the respective volume streams of process gases are switched at specified times, thereby resulting in a multi-layered buildup. When applying barrier coatings made of SiOx onto a substrate made of plastic, typically two layers are produced, namely a bonding layer and the barrier layer proper. Depending on the application, an additional protective layer can also be disposed on the barrier layer.

Typically, the process gases used contain HMDSO or HMDSN, for example for providing the silicon or oxygen as the oxidizing gas. The properties of the respectively deposited layer, and in particular the carbon content, are controlled by the quantity of the oxygen supplied and/or the manner in which the microwave energy is introduced.

Previously known processes are as yet unable to meet all requirements with respect to the barrier layers applied. In particular, it is shown that the barrier layers known to date are sensitive to expansions of the coated containers. Such expansions can be produced, for example, by an internal pressure when the container is filled, by an internal pressure of filled containers when filling with carbonated beverages or by external mechanical stresses on the empty or filled container. Such stresses can lead to the formation of cracks within the barrier layer or to crack propagation. Such cracks significantly impair the gas tightness of the barrier layer produced.

It is possible to simulate the generation of such cracks in a so-called creep test.

The object of the present invention is to improve upon a method of the above mentioned kind to thereby improve the properties of the barrier layer.

The object is achieved according to the invention in that the barrier layer is produced from a gas that contains at least one silicon compound and argon.

Another object of the invention is to prepare a workpiece of the above mentioned kind in such a way that the barrier layer exhibits improved properties.

The object is achieved according to the invention in that the barrier layer contains argon.

By using argon as a process gas when producing the barrier layer, oxygen is substituted at least in part or, at the very least, the amount of oxygen is reduced. The barrier layer is found to be improved both with regard to its resistance to external mechanical influences and with regard to other properties relative to the prior art.

Using argon gas as a process gas means that the barrier layers produced exhibit a higher density as compared to the prior art and have a more homogenous growth. This type of structure prevents or reduces the formation of cracks when under the influence of mechanical stresses, moreover, it is found that even when crack formation does occur, the number of cracks are fewer as compared to the prior art.

According to a typical process variant it is contemplated to use HMDSO as a process gas.

According to another process variant it is also possible to use HMDSN as a process gas.

Controllability of the process is supported by the use of a pulsed microwave to ignite the plasma.

The process may be simply carried out by supplying the process gas over time in a substantially constant volumetric flow during the production of the barrier layer.

A useful working range is defined by argon that is contained in the total volume of process gas in a proportion of 10 to 60 percent by element.

In particular, it is contemplated that argon is contained in the total volume of process gas in a proportion of 30 to 50 percent by element.

It is shown to be particularly advantageous if argon is contained in the total volume of process gas in a proportion of 36 to 44 percent by element.

A uniform structure of the barrier layer is supported by the fact that both argon and oxygen are contained in the total volume of process gas.

In particular, it is contemplated that oxygen is contained in the process gas in a proportion of 39 to 89 percent by element.

The method according to the invention is especially suited for controlling the work cycle of a coating process for bottles made of plastic. In particular, the interior of these bottles is coated with a layer of SiOx, in which the bonding of the layer made of SiOx to the plastic can be improved by means of an interlayer, which is designed as a bonding agent. The coating process is preferably carried out as a plasma impulse-induced chemical vapor deposition (PICVD) process. In such a process, the plasma is ignited by using microwave pulses. The pulses can be controlled with respect to their pulse width, pulse distance, and pulse height.

Figure 2:
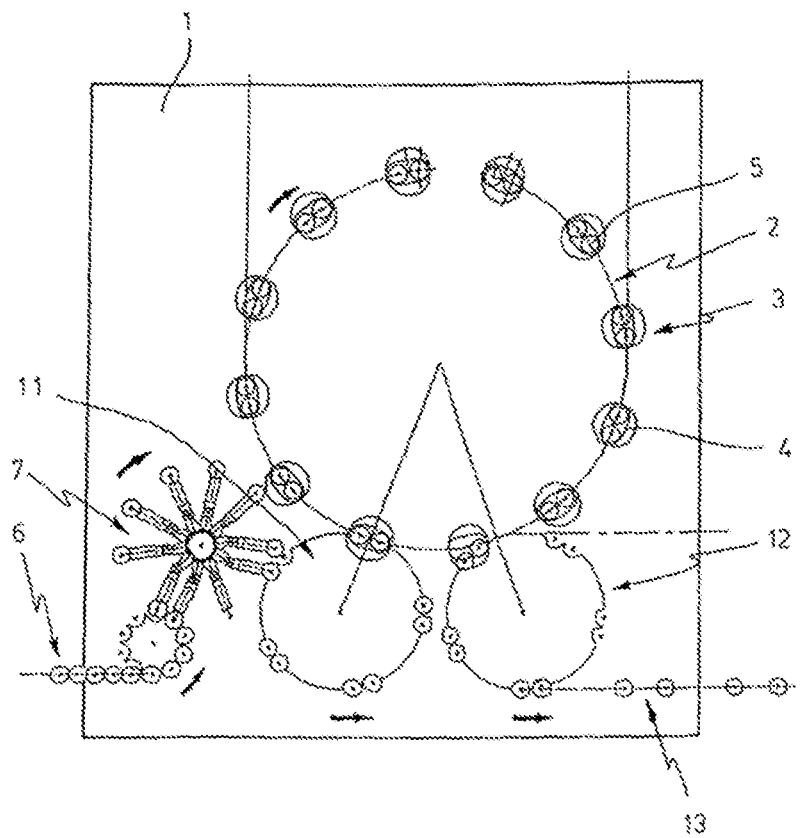
Figure 3:
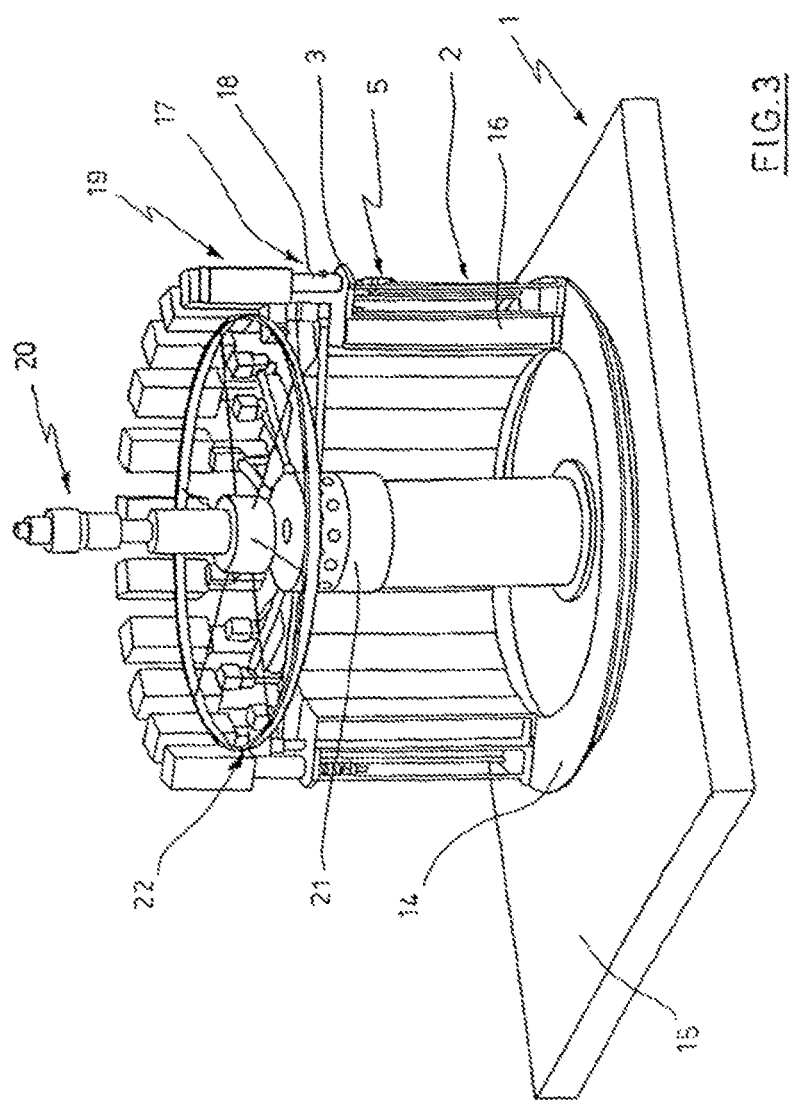
Figure 4:
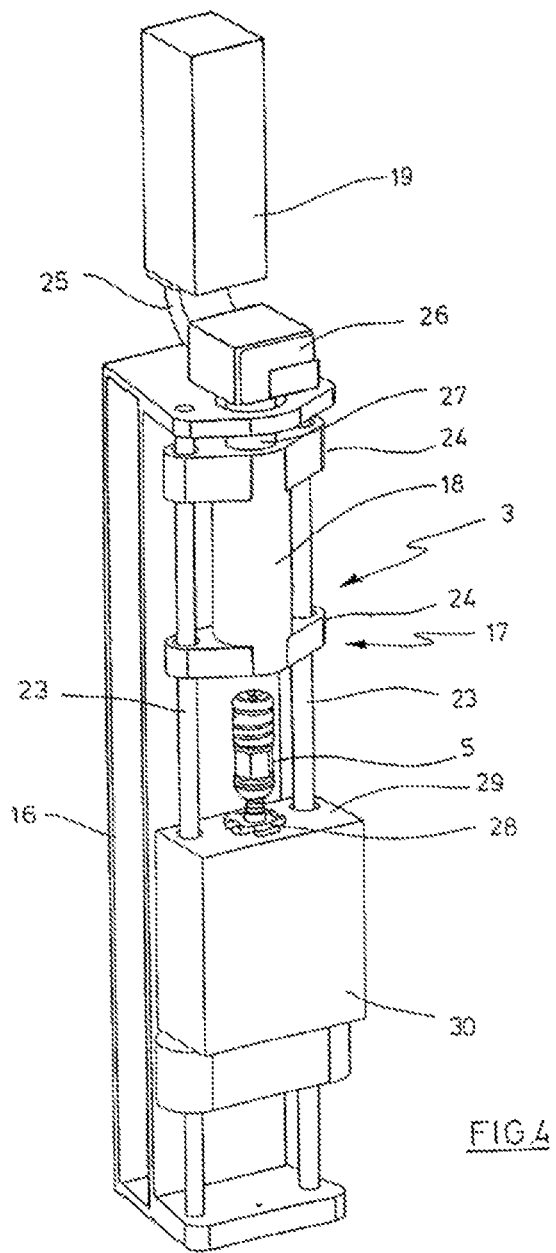
Figure 10:
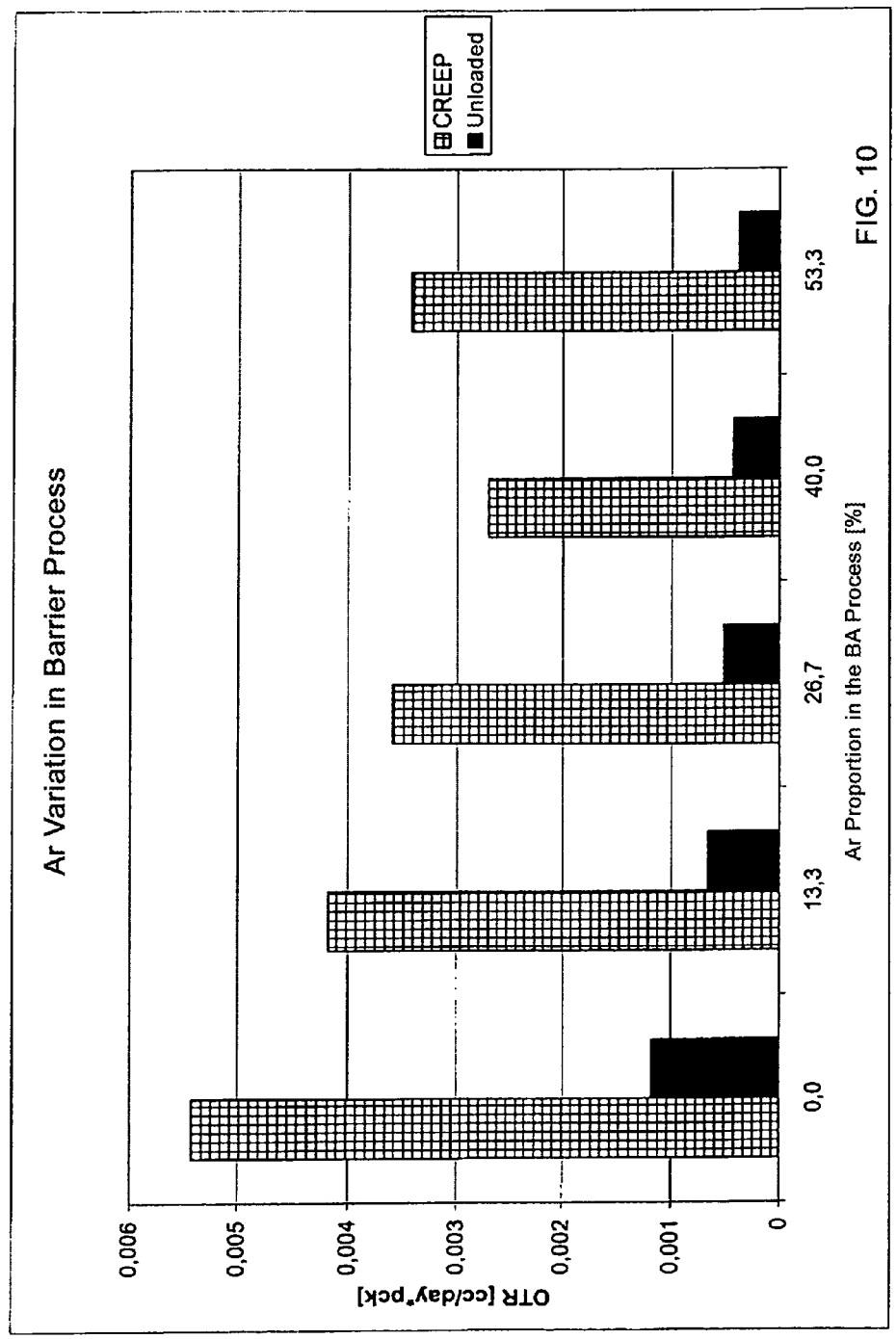

Exemplary embodiments of the invention are shown schematically in the drawings. In the drawings:

FIG. 1 shows a principle sketch of a plurality of plasma chambers which are arranged on a rotating plasma wheel and in which the plasma wheel is coupled to input and output wheels, FIG. 2 shows an arrangement, similar to FIG. 1, in which the plasma stations are each equipped with two plasma chambers, FIG. 3 shows a perspective view of a plasma wheel with a plurality of plasma chambers, FIG. 4 shows a perspective view of a plasma station with one cavity, FIG. 5 shows a front view of the device according to FIG. 4 with closed plasma chamber, FIG. 6 shows a cross sectional view along sectional line VI-VI in FIG. 5, FIG. 7 shows a partial view of a cross-section through a substrate that has a barrier layer, FIG. 8 shows a first table for illustrating different variants for carrying out the coating process with process data for producing the barrier layer, FIG. 9 shows process data for producing a bonding agent for the process variants according to FIG. 8, FIG. 10 shows a diagram for comparing barrier properties of barrier layers that have been deposited by the different process gas compositions according to FIG. 8, in each case for an unstressed basic state and after the barrier layer has been mechanically stressed.

The illustration of FIG. 1 shows a plasma module (1), which is provided with a rotating plasma wheel (2). Along a circumference of the plasma wheel (2), a plurality of plasma stations (3) are arranged. The plasma stations (3) are provided with cavities (4), or plasma chambers (17), for receiving the workpieces (5) to be treated.

The workpieces (5) to be treated are fed to the plasma module (1) in the area of an input (6), and are further conveyed to a transfer wheel (8) through a separating wheel (7), wherein the transfer wheel (8) is equipped with positionable support arms (9). The support arms (9) are arranged so as to be pivotable relative to a base (10) of the transfer wheel (8), thereby allowing the distance of the workpieces 5 relative to each other to be changed. This causes a transfer of the workpieces (5) from the transfer wheel (8) to an input wheel (11) with a spacing of the workpieces (5) which is increased relative to the separating wheel (7). The input wheel (11) transfers the workpieces (5) to be treated to the plasma wheel (2). After a treatment has been carried out, all treated workpieces (5) are removed from an output wheel (12) from the area of the plasma wheel (2) and are transferred into the area of an output section (13).

In the embodiment according to FIG. 2, the plasma stations (3) are each equipped with two cavities (4) or plasma chambers (17). Accordingly, two workpieces (5), respectively, can be treated simultaneously. In principle, it is also possible in this connection to construct the cavities (4) so as to be completely separate from each other. However, in principle, it is also possible to delimit in a common cavity space only partial areas relative to each other in such a way that an optimum coating of all workpieces (5) is ensured. In particular, it is contemplated to delimit the partial cavities relative to each other, at least through separate microwave couplings.

FIG. 3 is a perspective illustration of a plasma module (1) with a partially constructed plasma wheel (2). The plasma stations (3) are arranged on a support ring (14) which is designed as part of a rotary connection and is supported in the area of a machine base (15). The plasma stations (3) each have a station frame (16) which supports the plasma chambers (17). The plasma chambers (17) include cylindrical chamber walls (18) as well as microwave generators (19).

Arranged in a center of the plasma wheel (2) is a rotary distributor (20) through which the plasma stations (3) are supplied with drive means as well as energy. Ring-shaped lines (21), in particular, can be used to distribute said drive means.

The workpieces (5) to be treated are depicted underneath the cylindrically shaped chamber walls (18). For the sake of simplicity, bottom parts in each of the plasma chambers (17) are not delineated.

FIG. 4 shows a plasma station (3) in a perspective view. It can be seen that the station frame (16) is provided with guide rods (23) on which is guided a carriage (24) for supporting the cylindrical chamber wall (18). FIG. 4 shows the carriage (24) with chamber wall (18) in an elevated state, so that the workpiece (5) is released.

The microwave generator (19) is arranged in the upper portion of the plasma station (3). The microwave generator (19) is connected via a deflection means (25) and an adaptor (26) to a coupling duct (27) which opens into the plasma chamber (17). The microwave generator (19) can essentially be coupled in the immediate area of the chamber cover (31), as well as at a predeterminable distance from the chamber cover (31) by means of a spacer element and, thus, in a larger neighboring area of the chamber cover (31). The adaptor (26) functions as a transfer element and the coupling duct (27) is designed as a coaxial conductor. A quartz glass window is arranged in the area of an opening of the coupling duct (27) in the chamber cover (31). The deflection means (25) is designed as a hollow conductor.

The workpiece (5) is positioned by a holding element (28) arranged in the area of a chamber bottom (29). The chamber bottom (29) is designed as part of a chamber base (30). To allow for easier adjustment, it is possible to fix the chamber base (30) in the area of the guide rods (23). In another variation the chamber base (30) is fastened directly on the station frame (16). In such an arrangement, it is also possible, for example, to design the guide rods (23) in two parts in the vertical direction.

FIG. 5 shows a front view of the plasma station (3) in accordance with FIG. 3 with the plasma chamber (17) in the closed state. The carriage (24) with the cylindrically shaped chamber wall (18) is lowered relative to the positioning in FIG. 4, so that the chamber wall (18) is placed against the chamber bottom (29). The plasma coating can be carried out in this positioning state.

FIG. 6 shows, in a vertical sectional view, the arrangement according to FIG. 5. It can be seen in particular that the coupling duct (27) opens into a chamber cover (31) which includes a laterally projecting flange (32). Arranged in the area of the flange (32) is a sealing unit (33) which is acted upon by an inner flange (34) of the chamber wall (18). In a lowered state of the chamber wall (18), this results in a sealing action of the chamber wall (18) relative to the chamber cover (31). Another sealing unit (35) is arranged in a lower part of the chamber wall (18) to ensure at this location as well a sealing action relative to the chamber bottom (29).

In the positioning illustrated in FIG. 6, the chamber wall (18) surrounds the cavity (4), so that an interior space of the cavity (4), as well as an interior space of the workpiece (5), can be evacuated. To facilitate a supply of process gas, a hollow gas lance (36) is arranged in the area of the chamber bottom (30), wherein the gas lance can be moved into the interior space of the workpiece (5). To position the gas lance (36), said gas lance is held by a lance carriage (37) which is positionable along the guide rods (23). A process gas channel (38) extends within the lance carriage (37), wherein, in the raised position illustrated in FIG. 6, the process gas channel (38) is coupled to a gas connection (39) of the chamber base (30). The result of this configuration Is that hose-like connecting elements on the lance carriage (37) are avoided.

As an alternative to the above explained construction, it is also possible in accordance with the invention, to introduce the workpiece (5) into a plasma chamber (17) which is arranged so as to be immovable relative to the allocated support structure. As another alternative to the illustrated coating of the workpieces (5) with their openings directed downwardly in the vertical direction, a coating of the workpieces with their openings directed upwardly in the vertical direction is possible. In particular, it is contemplated to carry out coating of bottle shaped workpieces (5). Such bottles are also preferably made of a thermoplastic material. Preferably, the use of PET or PP is contemplated. In accordance with another preferred embodiment, the coated bottles are used to hold beverages.

In the following, a typical treatment procedure will be explained by way of an example of a coating process and is carried out in such a way that, initially, the workpiece (5) is transported to the plasma wheel (2) with the use of an input wheel (11) and the workpiece (5) is inserted into the plasma station (3) in an upwardly pushed state of the sleeve-like chamber wall (18). After the conclusion of the insertion procedure, the chamber wall (18) is lowered into its sealed position, followed initially simultaneously by evacuation of the cavity (4) and of the interior space of the workpiece (5).

Upon sufficient evacuation of the interior space of the cavity (4), the gas lance (36) is moved into the interior space of the workpiece (5), and the interior space of the workpiece (5) is separated off from the interior space of the cavity (4) through displacement of the holding element (28). It is also possible to move the gas lance (36) into the interior of the workpiece (5) already synchronously with the start of evacuation of the interior space of the cavity (4). Subsequently, the pressure in the interior space of the workpiece (5) is lowered still further. Moreover, it is also contemplated to execute the positioning movement of the gas lance (36) at least partially already parallel with the positioning of the chamber wall (18). After reaching a sufficiently low negative pressure, the process gas is conducted into the interior of the workpiece (5) and the plasma is ignited by means of the microwave generator (19). In particular, it is contemplated to deposit, by means of the plasma, a bonding agent on an inner surface of the workpiece (5) as well as the actual barrier layer consisting of silicon oxides.

Upon conclusion of the coating process, the gas lance (36) is again removed from the interior space of the workpiece (5) and the plasma chamber (17), as well as the interior space of the workpiece (5), are ventilated. After the ambient pressure within the cavity (4) has been reached, the chamber wall (18) is raised again in order remove the coated workpiece (5), and to introduce a new workpiece (5) to be coated.

Positioning of the chamber wall (18), of the sealing element (28) and/or of the gas lance (36) can be carried out with the use of different drive units. In principle, it is conceivable to use pneumatic drives and/or electric drives, in particular in the embodiment of a linear motor. In particular, however, it is contemplated to implement a cam control with a rotation of the plasma wheel (2) for facilitating an exact coordination of movements. The cam control can be executed, for example, in such a way that control curves are arranged along a circumference of the plasma wheel (2), wherein cam rollers are guided along the control curves. The cam rollers are coupled to the structural elements to be positioned respectively.

FIG. 7 shows a partial representation of a magnified cross-section through a workpiece (5), which is provided with a barrier layer (40). Typically, the barrier layer (40) is disposed on one side of a bottle-shaped container. In particular, the workpiece (5) is made of PET. Preferably, the barrier layer (40) is joined to the workpiece (5) by means of a bonding layer (41). In addition, it is possible to provide the barrier layer (40) in the area of its spread away from the workpiece (5) with a protective layer (42).

In principle, the bonding layer (41) and/or the protective layer (42) can be constructed as layers separate from the barrier layer (40). In particular, it is contemplated to implement so-called gradient layers, in which a layer-like effect is achieved by varying the elementary composition throughout the layer thickness (43). In this way, so-called gradient layers are provided. At least one of the chemical elements carbon, silicon, and oxygen is affected by the variation in the elementary composition. In principle, other chemical elements could also be used, additionally or alternatively.

FIG. 8 shows differing process parameters for five different samples. For sample number 1, a process is carried out in which the barrier layer (40) is deposited in the presence of oxygen as the process gas. For the sample numbers 2 through 5 the barrier layer (40) is deposited in the presence of oxygen and argon.

In the illustrated examples the barrier layer (40) is produced both in the presence of oxygen as well as in the presence of argon. The last column of the table indicates the proportion of argon to the total volume of process gas.

FIG. 9 shows the process parameters for applying the bonding layer (41) for the sample numbers according to FIG. 8. Here, the pulse times relate to the pulse width of the ignited microwave impulse and the pause times to the intervals between the individual microwave pulses. Also recorded are the microwave output and the applied process pressure. The flow for HMDSO and for oxygen is also listed.

FIG. 10 shows a compilation in the form of a bar diagram of the barrier properties of the samples according to FIG. 8. It can clearly be seen that the barrier properties resulting from a deposition of the barrier layer (40) in the presence of argon are significantly better than the barrier properties resulting from a deposition of the protective layer (42) in the presence of oxygen alone.

The functional properties of the bonding layer (41) and/or the protective layer (42) are attained by changing the elementary composition. Typically, the carbon content in percentage of elements is in the range of the functional bonding layer (41) and/or the protective layer (42) in the range of 10-60 percent by element. For the protective layer (42) a value of approximately 30 to 60 percent by element is preferred. The carbon content in the range of the functional barrier properties is approximately 5 percent by element.

In all of the exemplary embodiments described above, it is contemplated in particular to use another noble gas in addition to argon or to substitute argon for at least one other noble gas.

From the table in FIG. 8 it can be seen that in the process gas consisting of the component containing silicon, oxygen and argon, there is a clear surplus of oxygen. The proportion of the process gas containing silicon makes up only approximately 1 percent of the total volume of process gas. This reinforces a uniform formation of the barrier layer, in addition to which sufficiently high flow rates of the process gas are ensured to achieve a uniform distribution of the process gas within the container to be coated.

The coating process according to the invention is typically carried out with a proportion of process gas containing silicon to the total volume of process gas of approximately 0.7 percent by element to 1.2 percent by element. Also applicable is a range of 0.5 percent by element to 1.5 percent by element.

What is claimed is:

1. A method for plasma treatment of a container made of a thermoplastic material, the method comprising:
    inserting the container into a plasma chamber; and
    depositing a coating on the container following plasma ignition using a vacuum deposition technique;
    wherein the plasma is ignited by microwave energy,
    wherein the coating comprises a gas barrier layer and a bonding layer arranged between the container and the gas barrier layer,
    wherein the gas barrier layer contains $SiO_x$,
    wherein the bonding layer contains carbon,
    wherein the gas barrier layer is produced from a mixture of process gases that comprises at least one silicon-containing gas and argon gas,
    wherein the silicon-containing gas is present in an amount from 0.5 to 1.5 mole percent of the mixture of process gases,
    wherein argon is present in an amount of 40±4 mole percent of the mixture of process gases,
    wherein oxygen is present in an amount from 39 to 89 mole percent of the mixture of process gases, and
    wherein the silicon-containing process gas is HMDSN.

2. The method according to claim 1, wherein a pulsed microwave is used to ignite the plasma.

3. The method according to claim 1, wherein during the production of the barrier layer the process gas is supplied over time in a substantially constant volumetric flow.

4. The method according to claim 1, wherein the silicon-containing gas is present in an amount from 0.7 to 1.3 mole percent of the mixture of process gases.

5. The method according to claim 1, wherein the silicon-containing gas is present in an amount of 1.0 mole percent of the mixture of process gases.

6. The method according to claim 1, wherein argon is present in an amount of about 40 mole percent of the mixture of process gases.

* * * * *